United States Patent [19]
Goff et al.

[11] Patent Number: 5,485,759
[45] Date of Patent: Jan. 23, 1996

[54] BOAT TEST APPARATUS

[75] Inventors: Gerald L. Goff; Michael D. Smith, both of Austin; Michael R. Conboy, Buda, all of Tex.

[73] Assignee: Advanced Micro Devices, Inc., Sunnyvale, Calif.

[21] Appl. No.: 234,395

[22] Filed: Apr. 28, 1994

[51] Int. Cl.⁶ .................................................. E01C 23/01
[52] U.S. Cl. ................................................ 73/865.9; 33/522
[58] Field of Search ..................................... 73/1 J, 865.6, 73/865.8, 865.9; 33/522, 533, 542, 544.5, 549, 555, 567, 573; 224/191, 223, 255

[56] References Cited

U.S. PATENT DOCUMENTS 4,598,483  7/1986  Kygar ........................................ 33/533
4,713,551  12/1987  Layman et al. .......................... 250/561
4,993,163  2/1991  Possati et al. ............................. 33/542
5,291,025  3/1994  Smith ........................................ 250/561

*Primary Examiner*—Robert Raevis
*Attorney, Agent, or Firm*—Jenkins & Gilchrist

[57] ABSTRACT

A test fixture for a boat having a plurality of slots for holding wafers includes a base for fixedly holding a boat to be tested; a wafer simulator, which wafer simulator includes a plurality of wafers sized to properly seat in the plurality of slots in the boat; structure for moving the plurality of wafers of the wafer simulator wholly into and out of the plurality of slots in the boat; and structure determining whether the plurality of wafers is properly seated in the plurality of slots in the boat when the wafer simulator is moved wholly into the plurality of slots in the boat.

8 Claims, 2 Drawing Sheets

BOAT TEST APPARATUS

BACKGROUND OF THE INVENTION

1. Field of the Invention

The present invention relates generally to wafer carriers. More particularly, the present invention relates to systems for ensuring that such carriers are suitable for use.

2. Description of Related Art

Wafer carriers (or, as they are also called, "boats" or "cassettes") have been used for many years in the electronic arts, particularly the semiconductor arts, to support wafers during processing. Typical wafer carriers are described, for example, in U.S. Pat. Nos. 4,993,559; 4,355,974; 4,256,229; 4,515,104; 3,678,893; 3,534,862; 4,023,691; and 3,610,613, which are all incorporated herein by this reference thereto. Generally, such carriers are constructed so as to form a multitude of slots into which wafers may be placed for transport and processing. Quartz is a common construction material for wafer carriers that are intended for use in high temperature processes; in most other circumstances, plastic is the preferred construction material because it is relatively inexpensive and easy to work with. Other materials are also used.

The processing of wafers to make integrated circuit chips requires that they be successively immersed, sprayed and/or rinsed with liquids or gases. Some of the chemical baths include corrosive chemicals. Some involve very high temperatures.

Wafer carriers can, over the course of time, and after a multitude of processing cycles, become warped or worn. Warped, excessively worn, or other such flawed carriers can cause manufacturing problems. For example, if slots come to vary in size or in the amounts of inclination they allow wafers, the degree of exposure of different wafers in the same carrier to various processing agents can differ. This, in turn, can lead to undesirable manufacturing variances. Another major problem that can arise when damaged or warped boats are used relates to automated handling. Robots on assembly lines may not adjust to equipment that falls outside of prescribed tolerances. For example, if a robot is programmed to pick up a boat at a prescribed location, and if that boat is damaged or warped, there is a strong possibility that the boat will be mishandled by the robot. Because robots often travel at high rates of speed, mishandling damage can be severe, and can include chipped wafers, wafers with stress fractures, and even broken wafers. Damages can be exacerbated by one damaged wafer contaminating a multitude of surrounding wafers. One single mishandling incident can easily cause hundreds of thousands of dollars worth of damage.

Based upon the foregoing, it should be understood and appreciated that it is important that plastic boats and other such wafer carriers be checked periodically to ensure that they fall within prescribed tolerances. Although there has been made some developments made in slot size checking apparatus and methods for such boats; for example, those skilled in the art have heretofore measured slot width with plug gauges, calipers, and the like, and they have also developed complex measuring systems using lasers; the art has heretofore lacked an inexpensive apparatus and method for quicking and easily checking plastic boats and the like to ensure that they remain structurally suitable for use. It is a shortcoming and deficiency of the prior art that there has not heretofore been such an apparatus or method.

SUMMARY OF THE INVENTION

The present invention overcomes the shortcoming and deficiency mentioned above by providing a test fixture for a boat having a plurality of slots for holding wafers, which test fixture includes a base for fixedly holding a boat to be tested; a wafer simulator, which wafer simulator includes a plurality of wafers sized to properly seat in the plurality of slots in the boat; structure for moving the plurality of wafers of the wafer simulator wholly into and out of the plurality of slots in the boat; and structure for determining whether the plurality of wafers is properly seated in the plurality of slots in the boat when the wafer simulator is moved wholly into the plurality of slots in the boat.

Accordingly, an object of the present invention is to provide an inspection device that can quickly and easily determine whether a plastic boat or similar such apparatus has outlived its useful life.

Recognizing that many, if not most, wafer handling errors can be traced back to boats that are being used past their productive lifetimes, another object of the present invention is to provide a valuable tool that can be used in a production line to prevent such costly errors.

BRIEF DESCRIPTION OF THE DRAWINGS

For a more complete understanding of the present invention, and for further objects and advantages thereof, reference may now be made to the following detailed description of the invention taken in conjunction with the accompanying drawings wherein.

DETAILED DESCRIPTION OF THE INVENTION

Figure 1:
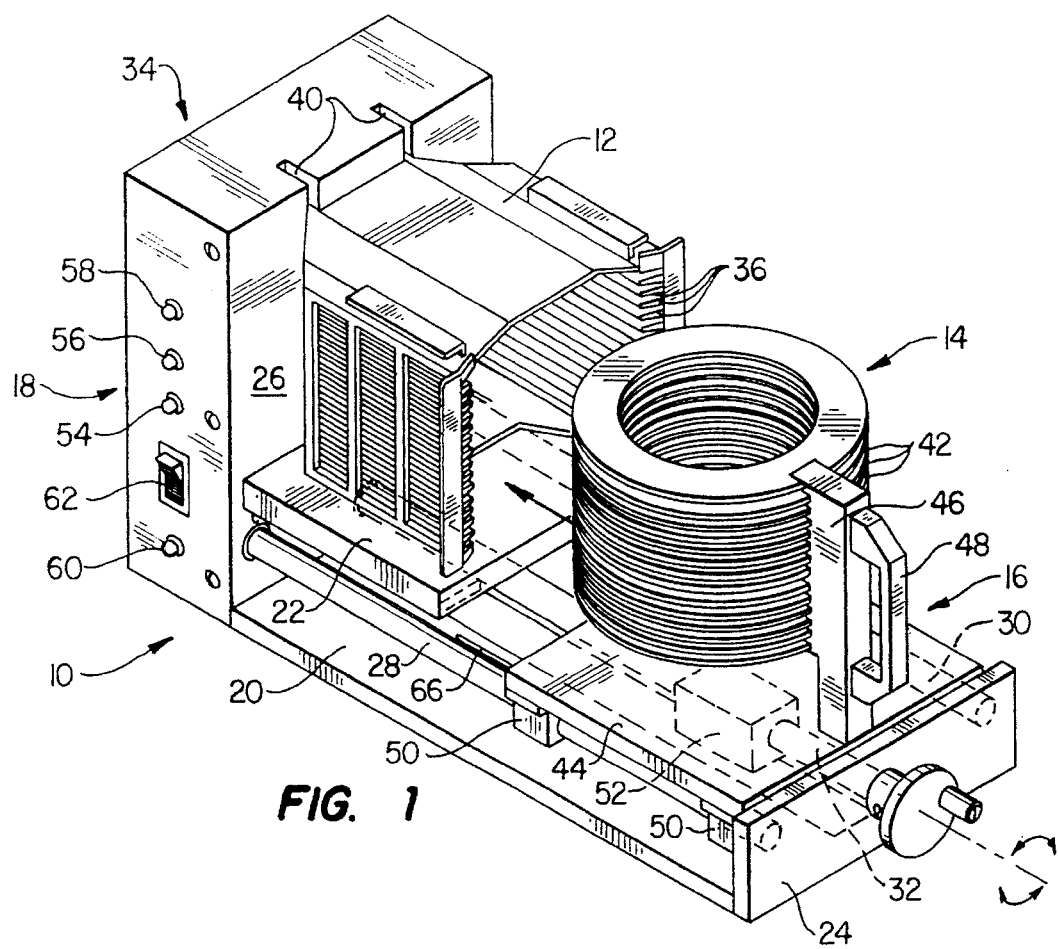
FIG. 1 is a perspective view of a plastic boat test apparatus according to the teachings of the present invention.

Referring now to the drawings wherein the elements shown are not necessarily drawn to scale and wherein like or similar elements are designated with identical reference numerals throughout the several views and, more particularly, to FIG. 1, there is shown a perspective view of a plastic boat test apparatus according to the teachings of the present invention.

In general, the plastic boat test apparatus may be seen in FIG. 1 to comprise a base (generally designated by reference numeral 10) for holding a boat 12, a wafer simulator (generally designated by reference numeral 14), structure for moving the wafer simulator 14 wholly into and out of the boat 12 (which structure is generally designated by reference numeral 16), and structure for determining whether the wafer simulator 14 seats properly in the boat 12 when the wafer simulator 14 is moved wholly into the boat 12 (which structure is generally designated by reference numeral 18). Each of these elements is discussed in further detail below.

Figure 2:
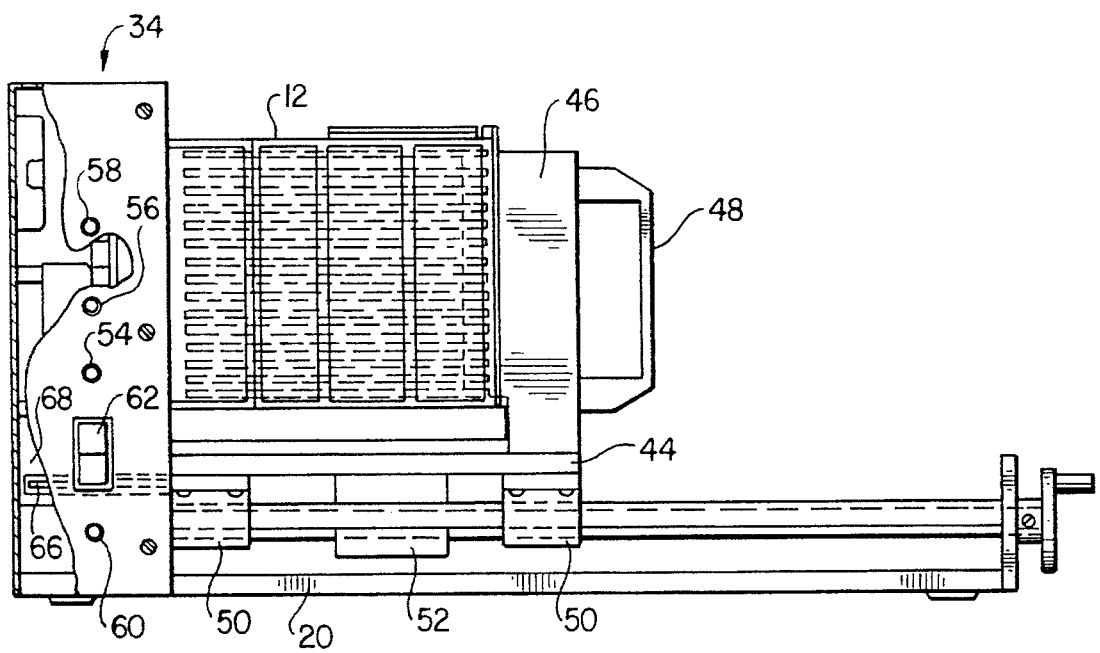
FIG. 2 is a side elevational view, in partial cross-section, of the apparatus of FIG. 1.

Broadly, the base 10 is any manner of structure that can fixedly hold a boat 12 in a position to be tested as described hereinbelow. Also, as shown in the particular embodiment of the present invention depicted in the FIGs., the base 10 can function to support other elements that form part of the present invention, such as the structure 16. More specifically, in the particular embodiment of the invention depicted in FIGS. 1, 2, and 3, the base 10 comprises two flat, parallel platforms 20, 22. One of the platforms, platform 20, serves as a base support for the entire testing apparatus. At opposing ends of that platform 20 are upward extending side walls 24, 26. Those two walls 24, 26, serve a number of functions. One of the functions is to hold and support two guide rods or rails 28, 30, the purpose of which is discussed hereinbelow. The walls 24, 26 also support a rotatable shaft 32, the purpose of which is also discussed hereinbelow. The wall 26 also serves as a side of a housing (generally designated by reference numeral 34) which contains much of the structure 18 for determining whether the wafer simulator 14 seats properly in the boat 12 when the wafer simulator 14 is moved wholly into the boat 12. Yet another function performed by the wall 26 is to serve to support the platform 22 which may be seen in the FIGs. to project therefrom in a cantilever fashion. In general, the base 10 may be formed of any material, e.g., a contamination resistant metal, that can perform all of the aforementioned support functions. The base 10 is also easily constructed by conventional techniques. It could, for example, be integrally formed. Alternatively, it could be formed of a number of pieces joined by conventional means, such as screws, welding bonds, or the like.

Figure 3:
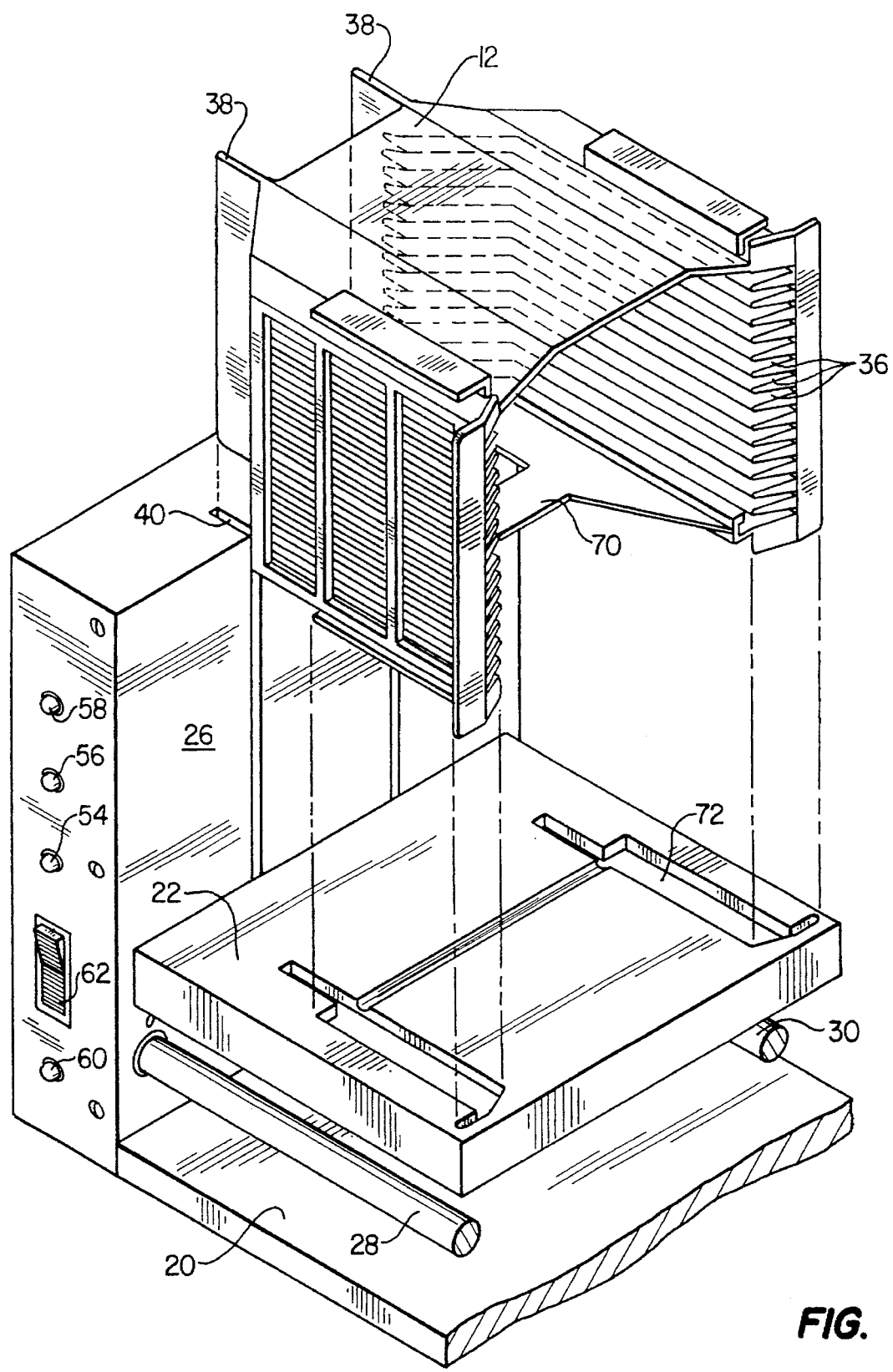
FIG. 3 is a view of a portion of the apparatus depicted in FIG. 1, which view specifically shows insertion of a plastic boat into the apparatus for testing.

At this point it is appropriate to discuss the boat 12 in more detail. The particular boat 12 depicted in FIG. 1 is a conventional plastic boat. Being conventional, it comprises structure forming a plurality of slots 36 designed to hold wafers for processing, movement, storage, and the like. In FIG. 3, the particular boat 12 shown may also be seen to have projecting portions 38. These projecting portions 38 may be received in slots 40 formed in the wall 26. This "reception" is clearly illustrated in FIG. 3. In FIG. 3 it may also be clearly seen that the bottom-most portion 70 of the boat 12 as its portions 38 are inserted into slots 40 is "H"-shaped. Still further, in FIG. 3 it may be seen that the platform 22 has an "H"-shaped indention 72 on the surface thereof. This indention 72 can snuggly receive the bottom-most portion 70 of the boat 12 and help hold it steady for subsequent testing. Thus, the boat 12, or any such boat, can be slid down the slots 40 in the wall 26 to come to rest on or partially in the platform 22 and to thereby be fixedly held by the base 10. Of course, there are a multitude of different boats presently made, and it should readily occur to those skilled in the art how a base can be configured to fixedly hold a boat for testing; all such configurations should be considered to fall within the scope of the appended claims.

The wafer simulator 14 depicted most clearly in FIG. 1 may be seen to comprise a plurality of wafers 42 sized to properly seat in the plurality of slots 36 in the boat 12. The wafer simulator 14 depicted in FIG. 1 may also be seen to be attached to the structure 16 for moving the plurality of wafers 42 of the wafer simulator 14 wholly into and out of the plurality of slots 36 in the boat 12. Although the degree of attachment depicted in FIG. 1 appears to be relatively permanent, which would be desirable if it was known that only one type of boat would ever be tested by the overall apparatus according to the teachings of the present invention, the manner of attachment could conventionally be made temporary, to facilitate changing wafer simulators 14 employed by the overall apparatus. This would make an apparatus according to the teachings of the present invention easily adaptable to test different types and sizes of boats.

The structure 16 for moving the plurality of wafers of the wafer simulator 14 wholly into and out of the plurality of slots in the boat 12 depicted in FIG. 1 comprises a number of subelements. One of the subelements is a moveable platform 44 on which the wafer simulator 14 is fixedly held. In the particular embodiment of the present invention depicted in the FIGs., the wafer simulator 14 is attached to a bar 46 having a handle 48. The bar 46, in turn, is attached to the moveable platform 44 by, ideally, means, such as a screw or even merely just a peg and hole, that allow relatively easy removal of the bar 46 and attached simulator 14 for replacement, substitution of a different simulator, or the like. The structure 16 also comprises subelements for moving the moveable platform 44. These subelements comprise the aforementioned handle 48 on the bar 46, which a user of the test apparatus could push or pull to move the bar 46, simulator 14 and platform 44. These subelements also comprise a rotatable shaft structure 32 that could employ conventional means, e.g., a rack and pinion, for moving the platform back and forth in the direction of the shaft 32 based upon turning of a crank one way or the other. Other details regarding the structure 16 may be seen in the FIGs. For example, the platform 44 has attached below it blocks 50 with voids therethrough. The purpose of these blocks 50 is to allow the platform to ride on the rails 28, 30 when moved. Likewise, there is a voided block 52 for the rotatable shaft 32. Inside this particular block 52, on the outside diameter of the void therethrough, are threads or the like that cooperate with threads or the like on the shaft to cause reciprocal movement of, ultimately, the wafer simulator 16 into and out of the slots 36 in the boat 12. Further details regarding operation of embodiments of the present invention are set forth hereinbelow.

The structure 18 for determining whether the plurality of wafers is properly seated in the plurality of slots in the boat when the wafer simulator is moved wholly into the plurality of slots in the boat, like the aforementioned structure 16 for moving the plurality of wafers of the wafer simulator 14 wholly into and out of the plurality of slots in the boat 12, depicted in the FIGs. comprises a number of subelements. There is, first of all, a subelement such as a projecting portion of the moveable platform (e.g., portion 66) that activates a U-shaped sensor (e.g., element 68 within housing 34 that detects presence of the protrusion 66 within its "U") when the wafer simulator 14 positioned thereon is moved wholly into the plurality of slots 36 in the boat 12. It should be understood that if the wafer simulator 14 cannot be wholly moved into the plurality of slots in the boat 12 when an attempt is made to do so, because the boat 12 is warped or otherwise damaged, the sensor will not be activated. The particular embodiment of the present invention depicted in the FIGs. may be seen to comprise a plurality of lights 54, 56, 58, 60. These lights could be connected to the sensor and other elements via conventional means (i.e., electrical circuits) to effectively communicate test results. For example, one of the three upper lights (e.g., light 54) depicted in the FIGs. could light to indicate that a test is underway. A second upper light (e.g., light 56) could light when the sensor is activated, indicating that the wafer simulator 14 properly seated in a boat 12 being tested and that the boat 12, therefore, is suitable for further use. The third upper light (e.g., light 58) could light when the sensor is not activated even though a test has been conducted. This light would therefore indicate that the wafer simulator 14 did not properly seat in a boat 12 being tested and that the boat 12 is not suitable for further use. Also shown in the FIGs. is a switch 62. The switch 62 could be connected to the aforementioned electrical circuits to empower them from a source of, e.g., AC power, and the lower light 60 could light to indicate that the entire test apparatus is empowered for use.

Operation of an embodiment of the present invention may now be described and fully understood. First, a boat 12 to be tested could be fixedly positioned in the test apparatus by sliding corresponding portions of it 38 into the slots 40 in the wall 26 until one side of the boat 12 comes to rest on the platform 22. A properly sized wafer simulator 14 could then be installed on the moveable platform 44; a properly sized wafer simulator being one that has wafers sized and spacedly disposed so as to be capable of being slid into all of the slots 36 for holding wafers formed by the boat 12. Then, the entire test apparatus could be turned on by flipping the switch 62, and an attempt could be made to move the wafer simulator 14 into the slots 36 in the boat 12. This attempt could be effected by turning a crank (e.g., crank 64) in the proper direction, or by a user of the apparatus pushing on the handle 48. The light 54 could light indicating a test is underway. If the wafer simulator properly seats based upon tripping of the sensor 68, the "pass" light 56 could light; otherwise, the "fail" light 58 will light. In either event, the wafer simulator 14 could then be pulled back away from the boat 12, and the boat 12 removed from the apparatus as the test would be completed.

Based upon the foregoing, those skilled in the art should now fully understand and appreciate that the present invention provides a test fixture for a boat 12 having a plurality of slots 36 for holding wafers. According to the teachings of the present invention, such a test fixture includes a base 10 for fixedly holding a boat 12 to be tested; a wafer simulator 14, which wafer simulator 14 includes a plurality of wafers 42 sized to properly seat in the plurality of slots 36 in the boat 12; structure 16 for moving the plurality of wafers 42 of the wafer simulator 14 wholly into and out of the plurality of slots 36 in the boat 12; and structure 18 for determining whether the plurality of wafers is properly seated in the plurality of slots in the boat when the wafer simulator is moved wholly into the plurality of slots in the boat. Those skilled in the art should also now fully understand and appreciate that the present invention provides an inspection device that can quickly and easily determine whether a plastic boat or similar such apparatus has outlived its useful life. Furthermore, recognizing that many, if not most, wafer handling errors can be traced back to boats that are being used past their productive lifetimes, the present invention also provides a valuable tool that can be used in a production line to prevent costly errors.

As is clearly seen, the present invention is a significant improvement in the art. The present invention is believed to be especially effective when configured and employed as described herein, however, those skilled in the art will readily recognize that numerous variations and substitutions may be made in the invention and its use and configuration to achieve substantially the same results as achieved by the embodiments and, in particular, the preferred embodiment expressly described herein. Each of those variations is intended to be included in the description herein and forms a part of the present invention. The foregoing detailed description is, thus, to be clearly understood as being given by way of illustration and example only, the spirit and scope of the present invention being limited solely by the appended claims.

What is claimed is:

1. A boat test fixture, said boat having a plurality of slots for holding wafers, said boat test fixture comprising:
   a base for fixedly holding said boat;
   a wafer simulator, said wafer simulator having a plurality of wafers sized to properly seat in said plurality of slots in said boat;
   structure for moving said plurality of wafers of said wafer simulator wholly into and out of said plurality of slots in said boat; and
   structure for determining whether said plurality of wafers is properly seated in said plurality of slots in said boat when said wafer simulator is moved wholly into said plurality of slots in said boat.

2. A boat test fixture as recited in claim 1, wherein said structure for moving said plurality of wafers of said wafer simulator wholly into and out of said plurality of slots in said boat comprises a rotatable shaft and a platform on which said wafer simulator is fixedly positioned, said rotatable shaft and said platform having portions which engage to cause reciprocal movement of said platform along said shaft.

3. A boat test fixture as recited in claim 2, wherein said structure for moving said plurality of wafers of said wafer simulator wholly into and out of said plurality of slots in said boat further comprises a hand crank on said rotatable shaft.

4. A boat test fixture as recited in claim 1, wherein said structure for moving said plurality of wafers of said wafer simulator wholly into and out of said plurality of slots in said boat comprises at least one guide rod having a central axis and a platform on which said wafer simulator is fixedly positioned, said guide rod and said platform having portions which engage to allow reciprocal movement of said platform along said central axis of said guide rod.

5. A boat test fixture as recited in claim 1, wherein said structure for determining whether said plurality of wafers is properly seated in said plurality of slots in said boat when said wafer simulator is moved wholly into said plurality of slots in said boat comprises a sensor that detects when said plurality of wafers is wholly moved into said plurality of slots.

6. A boat test fixture as recited in claim 5, wherein said structure for determining whether said plurality of wafers is properly seated when said wafer simulator is moved wholly into said plurality of slots in said boat further comprises at least two lights, one of which is activated by said sensor when an attempt is made to wholly move a plurality of wafers into said plurality of slots in said boat and the attempt succeeds, and the other of which is activated by said sensor when an attempt is made to wholly move a plurality of wafers into said plurality of slots in said boat and the attempt fails.

7. A boat test fixture comprising:
   a base for fixedly holding a boat;
   a wafer simulator having a simulated wafer sized to properly seat in a slot in said boat;
   a first structure for moving said simulated wafer into and out of said slot in said boat, said first structure comprising a rotatable shaft and a platform, said simulated wafer being affixed to said platform, and said rotatable shaft providing a means for moving said simulated wafer in and out of said boat; and
   a second structure for determining whether said simulated wafer is properly seated in said slot in said boat when said simulated wafer is moved into said slot in said boat.

8. The boat test fixture of claim 7, wherein said second structure includes an electronic means for determining whether said simulated wafer is correctly positioned within said slot when said simulated wafer is moved in said slot.

\* \* \* \* \*